(12) United States Patent
Kärnä et al.

(10) Patent No.: US 12,095,016 B1
(45) Date of Patent: Sep. 17, 2024

(54) OPTICALLY FUNCTIONAL MULTILAYER STRUCTURE AND RELATED METHOD OF MANUFACTURE

(71) Applicant: TactoTek Oy, Oulunsalo (FI)

(72) Inventors: Miikka Kärnä, Oulunsalo (FI); Ilpo Hänninen, Oulunsalo (FI); Samuli Yrjänä, Oulunsalo (FI); Simo Koivikko, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 18/398,773

(22) Filed: Dec. 28, 2023

(51) Int. Cl.
- *H01L 33/60* (2010.01)
- *H01L 25/075* (2006.01)
- *H01L 33/48* (2010.01)
- *H10K 50/842* (2023.01)
- *H10K 50/856* (2023.01)

(52) U.S. Cl.
CPC .......... *H01L 33/60* (2013.01); *H01L 25/0753* (2013.01); *H01L 33/483* (2013.01); *H10K 50/842* (2023.02); *H10K 50/856* (2023.02); *H01L 2933/0058* (2013.01)

(58) Field of Classification Search
None
See application file for complete search history.

(56) References Cited

U.S. PATENT DOCUMENTS

2017/0135198 A1* 5/2017 Keranen .................. H05K 3/28

* cited by examiner

*Primary Examiner* — Feifei Yeung Lopez
(74) *Attorney, Agent, or Firm* — Robert P. Michal, Esq.; Carter, DeLuca & Farrell LLP (57) ABSTRACT

An integrated optically functional multilayer structure including a flexible, substrate film arranged with a circuit design including electrical conductors on a first side of the substrate film; at least one light source provided upon the first side of the substrate film and connected to the circuit design the at least one light source internally illuminates at least a portion of the structure for external perception; and an optically transmissive layer produced upon the first side of the substrate film and the at least one light source said optically transmissive layer at least partially covering the substrate film and embedding the at least one light source; wherein the substrate film defines holes therethrough and upon one or more of them the optically transmissive layer defines an outcoupling surface, configured to redirect and reflect, incident light emitted by light sources of the at least one light source.

27 Claims, 4 Drawing Sheets

OPTICALLY FUNCTIONAL MULTILAYER STRUCTURE AND RELATED METHOD OF MANUFACTURE

FIELD OF THE INVENTION

The present invention relates in general to functional, integrated structures incorporating various functional features such as electronic, mechanical or optical elements. In particular, however not exclusively, the present invention concerns the provision of such a structure comprising at least one or more optoelectronic light sources for illuminating the internals or environment of the structure.

BACKGROUND

There exists a variety of different stacked assemblies and multilayer structures in the context of different functional ensembles e.g., in the field of electronics and electronic products. The motivation behind the integration of functionalities involving e.g., electronics, mechanical or optical features may be as diverse as the related use contexts. Relatively often size savings, weight savings, cost savings, or just efficient integration of components is sought for when the resulting solution ultimately exhibits a multilayer nature. In turn, the associated use scenarios may relate to product packages or casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different technique. For example, ready-made electronics such as various surface mount devices (SMD) may be mounted on a substrate surface that ultimately forms an inner or outer interface layer of a multilayer structure. Additionally, technologies falling under the term "printed electronics" may be applied to produce electronics directly and additively to the associated substrate. The term "printed" refers in this context to printing techniques capable of producing electronics/electrical elements from the printed matter, including but not limited to screen printing, flexography, and inkjet printing, through a substantially additive printing process. The used substrates may be flexible, stretchable and printed materials organic, which is however, not always the case.

Furthermore, the concept of injection molded structural electronics (IMSE) involves building functional devices and parts therefor in the form of a multilayer structure, which encapsulates electronic functionality as seamlessly as possible. Characteristic to IMSE is also that the electronics is commonly manufactured into a true 3D (non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment. Further layers and elements may be naturally added to the construction.

Optical features and functionalities to be provided in the afore-discussed integrated structures may include a number of light sources that are intended to illuminate e.g., selected internals of the structure or the environment of the structure. Illumination may have different motives per se, such as decorative/aesthetic or functional, such as guiding or indicative, motives.

Various challenges may commonly emerge in the described and other illumination applications and use scenarios, however.

For example, undesired light bleed or leakage out of the structure or between different internal volumes and areas thereof may easily cause both functional and aesthetic issues not forgetting transmission losses from the standpoint of a desired optical path and original illumination target, as being easily comprehended by a person skilled in the art. Yet, the perceivability of light sources themselves is one potential further issue. In some applications, the light sources should preferably remain hidden or only weakly or occasionally exposed.

Additionally, achieving sufficient resolution and in many cases, also dynamic or adaptive, control of internally transmitted and ultimately outcoupled light in terms of e.g., illuminated surface area shape, size, or location may at least occasionally turn out difficult with highly integrated structures. In various solutions, controlling or specifically, improving e.g., the uniformity of light over its outcoupling area(s), which may sometimes also span considerably large areas in relation to the overall dimensions of the structure or its selected surface, has been previously found burdensome. The same applies to spatial control of illumination and light outcoupling also more generally. This may be an important issue e.g., when the surface contains e.g., an icon or symbol to be evenly lit to indicate to a viewer external to the structure that a device functionality or status associated with the icon or symbol is active, for example. Simply harnessing several light sources to more effectively light up a joint target area or feature, such as an icon, may still cause illumination hot spots and additional leakage while also requiring more, often precious, power and space. Obtaining decent mixing of brightness or colors may also be challenging and require a relatively long distance between the light source(s) and area or feature to be illuminated therewith especially in large area illumination applications, which adds to the size of the structure required or reduces the area that can be illuminated with proper mixing performance.

Adding multiple, potentially complex light guiding, incoupling, outcoupling, limiting or generally processing elements into the structure has, in turn, its own drawbacks such as increased space consumption, weight and other design constraints. Maintaining the optical performance of the structure high, with reference to e.g., low leakage, loss, and similar objectives, may easily further limit the shape of the structure or included elements to ones otherwise suboptimum in their intended use case.

Yet, if the optical features such as illumination features are to be combined with other features in the structure, the other features may negatively affect the lighting performance due to their shadowing or masking effect, for example, and occasionally also the optical features may prevent or complicate the implementation of the other features due to e.g., space constraints faced.

Manufacturing process—wise the adoption of various optical features in the structures may increase besides the overall process complexity also the amount of faced complications due to the added features' mutual (in)compatibility or (in)compatibility with the remaining materials and features as well as related process phases, considering e.g., overmolding, resulting in an increased fail rate/reduce yield.

For example, if a material associated with a lower melt temperature (e.g. polymethyl methacrylate, PMMA) is utilized together with a higher melt temperature molding material (e.g. polycarbonate, PC), features printed or otherwise established on the lower melt temperature material may degrade or wash out during molding.

SUMMARY

The objective of the present invention is to at least alleviate one or more of the drawbacks associated with the known solutions in the context of functional integrated structures comprising electronics such as optoelectronic light sources, and related methods of manufacture.

The objective is achieved with various embodiments of an integrated, functional multilayer structure and a related method of manufacture for providing the multilayer structure.

According to one aspect, an integrated optically functional multilayer structure comprises
- a flexible, optionally 3D-formable and further optionally thermoplastic, substrate film arranged with a circuit design comprising at least a number of electrical conductors on a first side of the substrate film;
- at least one light source provided upon the first side of the substrate film and connected to the circuit design, said at least one light source being configured to internally illuminate at least a portion of the structure for external perception; and
- an optically transmissive layer, optionally of plastic or thermoplastic material, such as polycarbonate, produced, preferably molded, upon the first side of the substrate film and the at least one light source, said optically transmissive layer at least partially covering the substrate film and embedding the at least one light source;
- wherein the substrate film defines one or more holes therethrough and upon each of the one or more of them the optically transmissive layer defines an outcoupling surface preferably tilted away from a surface plane or direction of the adjacent areas of the substrate film and configured to redirect and reflect, preferably by TIR (total internal reflection), incident light emitted by one or more light sources of the at least one light source.

In some embodiments, the outcoupling surface may define or comprise one or more light processing or redirecting features, optionally essentially specularly reflecting features or diffusively reflecting scattering features, optionally including a rough surface texture or specifically, a surface relief pattern.

In connection with said one or more holes, the structure may comprise a greater cavity limited by at least the outcoupling surface of the optically transmissive layer and/or side walls of the substrate film defining the hole, said cavity being optionally filled with fluid such as air or other gaseous substance, or with preferably molded material.

The substrate film may in some embodiments comprise at least one elongated bridge portion hosting a part of the circuit design providing electrical connection to the at least one light source and optionally further electronic or electrical functional elements optionally from an external device or a further layer of the structure.

When the the substrate film comprises an island portion, optionally essentially a central portion, at least partially separated from other portion of the substrate film by one or more of said one or more holes while remaining connected thereto by the at least one bridge portion.

The structure may further comprise at least one light directing or scattering feature, optionally in or on the substrate film and/or optically transmissive layer, configured to direct or spread incident light upon the bridge portion of the substrate film, said at least one light directing or scattering feature optionally comprising printed diffusive ink, diffusive surface relief pattern, and/or diffusive particles.

The optically transmissive layer may define a recess or protrusion, optionally at least cross-sectionally rectangular or angled protrusion, substantially upon at least one of the one or more holes extending away from the substrate film and/or in the optical path of light incident and reflected from the light outcoupling surface. The light outcoupling surface, recess or protrusion in the optically transmissive layer, and associated light exit area on the outer surface of the structure may be mutually aligned substantially in the thickness direction of the structure or sloped or otherwise diverging therefrom.

The structure may in some embodiments comprise an optically masking and preferably essentially opaque, optionally dyed, painted or otherwise pigmented, or an optically transmissive, optionally still translucent, constituent layer. The constituent layer may in some embodiments comprise polymethyl methacrylate or other material preferably having a lower melt temperature than the one of the optically transmissive layer, provided, preferably molded, upon the optically transmissive layer.

The substrate film and the optically transmissive layer may be configured to define an injection hole extending through both and being filled with material of the constituent layer provided through the injection hole. With the injection hole being provided, the constituent layer may be formed so that the constituent layer is disposed on a side of the structure that is intended to face the environment, such as user, without any visual marks of an injection hole being left on the constituent layer.

The structure may comprise a further film on a side of the optically transmissive layer opposite to the side facing the substrate film, said further film preferably facing the use environment and potential user of the structure, said further film optionally comprising a plurality of at least partially physically separate portions with holes in between, said structure optionally further comprising a preferably molded shell layer on the further film. The shell layer may be at least partially optically clear, opaque or translucent, further optionally painted.

A further film may comprise optical masking capacity—providing translucent or opaque surface or volume, such as a dyed or pigmented surface or volume, one or more light processing features, optionally scattering features such as a translucent print or a surface relief structure.

The substrate film may in some embodiments comprise, on the first side and/or opposite second side thereof, at least one functional element selected from the group consisting of: data processing element, a SIP (system-in-a-package), photovoltaic cell, energy reservoir, capacitor, supercapacitor, memory element, sensor, electrode, connector such as an electrical connector, capacitive sensor or sensing element, force sensor or sensing element, pressure sensor or sensing element, light sensor or sensing element, strain gauge, heating or de-icing element, and a camera.

The structure may further comprise a molded layer on the second side of the substrate film, at least partially embedding one or more of the at least one functional element.

A part of the circuit design may optionally extend, optionally by electrically conductive via, to the second side of the substrate film and electrically connect with the at least one functional element thereon.

The structure may comprise an electrically conductive shielding layer, optionally comprising or consisting of conductive ink such as silver ink, copper film or other conductive material film, on a second, opposite, side of the substrate film, preferably disposed at a distance provided by at least one optional intermediate layer such as adhesive layer, optionally adhesive tape layer, from the substrate film.

The structure may then also further comprise at least one additional layer such as a further adhesive layer, such as adhesive tape layer, on a side of the shielding layer opposite to the side facing the substrate film and preferably configured to face and contact and external and potentially electrically conductive host surface, said shielding layer, intermediate layer, and at least one additional layer being optionally integrated as a multi-layer adhesive tape.

The shielding layer may be electrically connected to the circuit design on the first substrate film, optionally via electrically conductive via through the substrate film or at least partially externally configured wiring portion.

According to a further aspect of the invention, a method for manufacturing an integrated optically functional multilayer structure is provided, the method comprising:
  obtaining a flexible, optionally 3D-formable and thermoplastic, substrate film containing one or more through-holes;
  providing at least a first side of the substrate film with a circuit design comprising a number of electrical conductors preferably by printed electronics technology;
  arranging at least one light source upon the first side of the substrate film as connected to the circuit design; and
  producing, preferably through molding such as injection molding, high pressure molding, low pressure molding, silicone molding or using one or more other manufacturing methods, an optically transmissive layer upon the first side of the substrate film and the at least one light source, said optically transmissive layer at least partially covering the substrate film and embedding the at least one light source,
  wherein a mold tool is partially directed through the substrate film from an opposite second side to the first side of the substrate film via said one or more through-holes so as to cause establishing, from material subsequently flowing around the mold tool on the first side of the substrate film and defining the optically transmissive layer, a light outcoupling surface, preferably at least partially tilted away from a surface plane or direction defined by adjacent areas of the substrate film, said light outcoupling surface abutting a cavity established on the first side of the substrate film from the space occupied by the mold tool during molding.

Obtaining the substrate film containing one or more through-holes may in some embodiments comprise obtaining a substrate film and providing the substrate film with one or more through-holes, such that said one or more through-holes determine a desired pattern or area for outcoupling light from the internals of the structure to an environment of the structure.

The one or more through-holes may be provided in the substrate film to retain at least one elongated bridge portion of the substrate film, the method comprising providing at least a part of the circuit design on the elongated bridge portion, thus providing electrical connection to the at least one light source and optionally further electronic or electrical functional elements optionally from an external device or a further layer of the structure.

The method may further comprise providing at least one light directing or scattering feature, optionally in or on the substrate film and/or optically transmissive layer, configured to direct or spread incident light thereon upon the bridge portion of the substrate film, said at least one light directing or scattering feature optionally comprising printed diffusive ink, diffusive surface relief pattern, and/or diffusive particles.

The provided mold tool may be shaped to provide the optically transmissive layer with a greater cavity in connection with said one or more holes, said greater cavity being limited by at least the outcoupling surface of the optically transmissive layer and/or side walls of the substrate film defining the hole, wherein the method optionally further comprises filling the cavity with fluid such as air or other gaseous substance, or preferably molded material.

The optically transmissive layer may be produced to define a recess or protrusion, optionally at least cross-sectionally rectangular or angled protrusion, substantially upon at least one of the one or more holes extending away from the substrate film and/or in the optical path of light incident and reflected from the light outcoupling surface. The light outcoupling surface, recess or protrusion in the optically transmissive layer, and associated light exit area or light outcoupling area on the outer surface of the structure may be mutually aligned substantially in the thickness direction of the structure or sloped or otherwise diverging therefrom.

The method may additionally comprise producing, through molding such as injection molding, an optically masking and preferably essentially opaque, or an optically transmissive, optionally still translucent, constituent layer, optionally prior to the molding of the optically transmissive layer.

The method may further comprise providing the substrate film and the optically transmissive layer to define a preferably concentric injection hole extending through both and injection molding the material of the constituent layer through the injection hole.

The method may optionally comprise providing a further film on a side of the optically transmissive layer opposite to the side facing the substrate film, said further film preferably facing the use environment and potential user of the structure, said further film optionally provided as comprising a plurality of at least partially physically separate portions with holes in between, the method optionally further comprising molding a shell layer on the further film.

Embodiments of the method may comprise providing the substrate film, on the first side and/or opposite second side thereof, with at least one functional element selected from the group consisting of: data processing element, a SIP (system-in-a-package), photovoltaic cell, energy reservoir, capacitor, supercapacitor, memory element, sensor, electrode, connector such as an electrical connector, capacitive sensor or sensing element, force sensor or sensing element, pressure sensor or sensing element, light sensor or sensing element, strain gauge, heating or de-icing element, and a camera.

A molded layer may be molded on the second side of the substrate film, to at least partially embed one or more of the at least one functional element.

Part of the circuit design may be provided to extend, optionally by electrically conductive via, to the second side of the substrate film to electrically connect with the at least one functional element thereon.

An electrically conductive shielding layer, optionally comprising or consisting of conductive ink such as silver ink, copper film or other conductive material film, may be further provided on a second, opposite, side of the substrate film, and optionally providing at least one intermediate layer such as adhesive layer, optionally adhesive tape layer, between the electrically conductive shielding layer and the substrate film.

At least one additional layer such as a further adhesive layer, such as adhesive tape layer, may be provided on a side of the conductive shielding layer opposite to the side facing the substrate film and preferably configured to face and contact and external and potentially electrically conductive host surface, said shielding layer, intermediate layer, and at least one additional layer being optionally integrated as a multi-layer adhesive element such as tape.

An electrical connection may be provided between the shielding layer and the circuit design on the first substrate film, optionally via electrically conductive via through the substrate film or at least partially externally configured wiring portion.

At least a surface portion of the optically transmissive layer and/or an additional layer or a film thereon may in some embodiments of a method be colored by optionally opaque paint or dye to provide an optical mask.

The present solution yields different advantages over a great variety of previously applied solutions, naturally depending on each embodiment thereof.

For example, at least transmission and (out)coupling of light may be effectively controlled and related optical efficiency and various other characteristics of interest, such as achieved illumination uniformity, optimized in a concerned optical structure by clever, joint configuration of the included materials and elements such as light sources and outcoupling surfaces, with respect to e.g., their mutual positioning, orientation, dimensions and other characteristics.

The holes, light sources, and optically transmissive layer together with outcoupling surface may be mutually configured, along with possible further layers such as constituent layer, to provide a structure where the structure itself is illuminated at selected portions and with light being directed in a selected way, to exhibit a desired appearance in terms of at least illumination to a viewer from outside of the structure.

Manufacturing-wise printing and other cost-efficient, flexible and versatilely controllable methods, such as various molding techniques may be cleverly applied to manufacture desired features in addition to the use of ready-prepared elements such as films, components, or modules.

By manufacturing an outcoupling surface to be provided as being formed from the optically transmissive layer, the need for separate outcoupling features such as reflectors may be eliminated. No separate steps for providing the outcoupling features are required and a mutual positioning of outcoupling features such as separate outcoupling elements and transmissive layer does not have to be ensured by e.g. proper placement of the outcoupling elements.

By integrally and monolithically forming outcoupling features as outcoupling surfaces in the optically transmissive layer advantageously by locally deforming the associated materials during a molding process, a very efficient optical solution may be provided as well as potentially yielding space, material, and weight savings in addition to simplifying the structure and potentially also the manufacturing process among other benefits.

Different embodiments of the present invention may be versatilely utilized and included in different applications, e.g., in electronic or electronics-containing appliances including but not limited to computers, tablets, smartphones, other communication devices, wearables, av equipment, optical devices, domestic appliances, vehicles, displays, panels, medical devices, smart clothing, furniture, pieces of art, etc.

Various additional utilities different embodiments of the present invention offer will become clear to a skilled person based on the following more detailed description.

The expression "a number of" may herein refer to any positive integer starting from one (1).

The expression "a plurality of" may refer to any positive integer starting from two (2), respectively.

The terms "first" and "second" are herein used to distinguish one element from other element(s), and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also un-recited features. The features recited in various embodiments and e.g., dependent claims are mutually freely combinable unless otherwise explicitly stated.

BRIEF DESCRIPTION OF FIGURES

Selected embodiments of the present invention are illustrated by way of example, and not by way of limitation, in the figures of the appended drawings.

DETAILED DESCRIPTION OF SOME EMBODIMENTS

FIGS. 1A and 1B generally illustrate, at 100, via a cross-sectional sketch, an embodiment of a multilayer structure in accordance with the present invention.

The multilayer structure includes at least one substrate film 102, which is preferably of flexible and 3D-formable (3D-shapeable) material, such as thermoformable (plastic) material.

Item 108 refers to at least one, optionally plastic or thermoplastic while at least optically transmissive layer provided preferably by molding upon the substrate film 102. The optically transmissive layer 108 should be able to convey light at least having regard to selected wavelengths such as substantially all or selected wavelengths of visible light, or generally at least part of the wavelengths emitted by the included light source(s), which typically while not necessarily include visible wavelengths.

The optically transmissive layer 108 comprises a first side and a related first surface that may be targeted towards the use environment of the structure and e.g., a user 113 of the structure located in such environment, depending on the application. Yet, the optically transmissive plastic layer 108 comprises an opposite second side and associated second surface essentially facing at least one instance of the substrate film 102 and potentially a host device or structure, for instance.

As the optically transmissive layer 108 is indeed supposed to convey or guide light, it shall comprise optically at least translucent, optionally substantially transparent, material, wherein the optical transmittance of the overall optically transmissive layer 108 may in some use scenarios preferably be at least 50%, but the desired transmittance may indeed radically differ between all possible use scenarios. In some embodiments at least about 80% or 90% transmittance could be preferred for maximizing the light output from the structure and low losses, while in some other scenarios lower figures could be quite sufficient if not even advantageous, if e.g., light leakage related issues are to be minimized. The transmittance may be defined or measured in a selected direction, e.g., main direction of light propagation and/or in a transverse direction (i.e., thickness direction) to the surface of the substrate film 102, having regard to the wavelengths of interest, typically including visible wavelengths as discussed above.

In terms of applicable materials, the optically transmissive layer 108 may generally comprise, for example, at least one material selected from the group consisting of: polymer, organic material, biomaterial, composite material, thermoplastic material, thermosetting material, elastomeric resin, PC, PMMA, ABS, PET, copolyester, copolyester resin, nylon (PA, polyamide), PP (polypropylene), TPU (thermoplastic polyurethane), polystyrene (PS or GPPS, general-purpose-polystyrene), silicone, TPSiV (thermoplastic silicone vulcanizate), epoxy, and MS resin.

The substrate film 102 may optionally comprise material or material layer same as that of the optically transmissive plastic layer 108 or at least having a similar or lower refractive index therewith. Accordingly, the resulting interface 102, 108 may be made optically transparent or enabling a total internal reflection (TIR) type function, respectively, for light arriving at the interface from withing the optically transmissive layer 108.

In some embodiments, tinted or more strongly colored resin as the material of the optically transmissive layer 108 may provide a feasible option for limiting undesired light leakage within and outside the structure 100 to close elements or generally distances, and hide the internals such as light source 104 or other circuitry from external perception. Originally optically substantially clear base material such as PC or other plastic resin could be thus doped with a colored masterbatch. In many use scenarios wherein the structure 100 should be only e.g., few millimeters or a centimeter thick in total, whereupon optically transmissive layer 108 should be even thinner, using about 2-4 mm, such as 3 mm, thick layer of plastic resin provided with a selected masterbatch (e.g. white or desired selective wavelength resin, optionally also e.g. IR (infrared) resin that might find use e.g., IR remote control applications) in a desired concentration (e.g. let-down ratio of about 1%) for establishing the optically transmissive layer 108, may provide quite satisfying results. Generally, in many embodiments in the context of the present invention, a feasible let-down (dosing or doping) ratio is indeed about 5%, 4%, 3%, 2%, 1% or less. For example, suitable industrial grade masterbatches for the purpose are provided by Lifocolor™ A so-called "hidden until lit" effect may be achieved for the light source 104 or other features included in the structure 100, for instance, by adding translucent, e.g. a selected color exhibiting, masterbatch in the injection molded base resin constituting the optically transmissive layer 108.

The substrate film 102 and/or further film(s) or generally material layer(s) included in the multilayer structure may comprise at least one material selected from the group consisting of: polymer, thermoplastic material, electrically insulating material, PMMA (Polymethyl methacrylate), Poly Carbonate (PC), flame retardant (FR) PC film, FR700 type PC, copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

Depending on the embodiment in question, the substrate film 102 and/or further film(s) or layers potentially included in the structure may comprise or be of optically substantially transparent or at least translucent material(s) having regard to the wavelengths of interest, such as visible light, with associated optical transmittance of about 80%, 90%, 95%, or more, for example. This may be the case especially when the substrate film 102 is configured in the structure 100 so as to effectively convey or pass light emitted by a light source 104. Yet, in some embodiments the used substrate film 102 could be substantially opaque, black and/or otherwise exhibitive of dark colour, to block incident light from passing through it (mask function).

The thickness of the substrate film 102 and optionally of further film(s) or layer(s) included in the structure 100 may vary depending on the embodiment; it may only be of few tens or hundreds of a millimeter, or considerably thicker, in the magnitude of one or few millimeter(s), for example.

The thickness of the optically transmissive layer 108 may also be selected case-specifically but thicknesses of few millimeters, such as about 3-5 millimeters, may be applied. In some embodiments, only about 2 millimeter thickness or less, potentially only e.g., few tenths of a millimeter, could be sufficient if not optimum, while in some other embodiments the thickness could be considerably more as well, e.g. about 1 cm or more at least in places. The thickness may indeed locally vary. The optically transmissive layer 108 may optionally comprise further recesses or further internal cavities for accommodating various elements such as electronic or optical elements, for further light guiding, processing, and/or thermal management purposes, for instance.

The film 102, the optically transmissive layer 108 as well as further layers such as further substrate film(s), further optically transmissive layer(s), and/or optically masking layer(s) of the structure may be essentially planar (width and length greater, e.g., different in the order of magnitude, than the thickness). The same generally applies also to the overall structure as illustrated in the figures even though also other, non-planar shapes are fully feasible.

Item 104 refers to a light source preferably of optoelectronic type. The light source 104 may be or comprise a semiconductor, a packaged semiconductor, a chip-on-board semiconductor, a bare chip, electroluminescent and/or a printed type light source, preferably a LED (light-emitting diode) or OLED (organic LED). The light source 104 may preferably be of at least a side-shooting type, or also of top-shooting type. Still, multi-side shooters or bottom-shooters may be utilized depending on the characteristics of each particular use case.

Still packaging-wise, the light source 104 could be optionally of flip-chip type. In some embodiments, the light source may contain multiple (two, three, four, or more) light-emission units such as LEDs packaged or at least grouped together. For example, a multi-color or specifically RGB LED of several LED emitters could be provided within a single package.

The light source 104 is provided, such as fabricated (optionally printed with reference to e.g., OLED) or, in the case of at least partially ready-made component, mounted on the substrate film 102, on a first side and associated surface thereof, which faces the optically transmissive layer 108 instead of the opposite second side and surface of the film 102. Yet, additional host layer(s) such as films may be included in the structure for accommodating further elements such as light sources or other electronics. For mounting, e.g., adhesive (conductive or non-conductive) may be generally applied.

The light source 104 may be at least partially embedded in the material of the optically transmissive layer 108.

The substrate film 102 defines one or more holes 102*a* therethrough and upon (or in connection with) one or more of the holes 102*a* the optically transmissive layer 108 defines an outcoupling surface 108*a* configured to redirect and reflect incident light emitted by the one or more light sources of the at least one light source 104. The outcoupling surface 108*a* being configured to redirect and reflect incident light may refer to the associated portion of the optically transmissive layer 108 being selectively shaped, in terms of an associated tilt angle of the surface or one or more dimensions of an associated greater cavity. Configuring of the outcoupling surface may additionally refer to selection of depth at which the outcoupling surface 108*a* is provided in relation to a thickness of the transmissive layer 108.

The outcoupling surface 108 may be configured to reflect the incident light emitted by the one or more light sources 104 by total internal reflection (TIR).

The outcoupling surface may in some embodiments define or comprise one or more light processing or redirecting features. Such features may be essentially specularly reflecting features or diffusively reflecting scattering features, and may optionally include a rough surface texture or specifically, a surface relief pattern.

The one or more holes 102*a* may be provided as being shaped such that said one or more through-holes determine a desired pattern or area for outcoupling light from the internals of the structure to an environment of the structure.

The outcoupling surface 108*a* may be tilted away from a surface plane or direction of the adjacent areas of the substrate film 102, as shown in FIGS. 1A and 1B.

The optically transmissive layer 108 may thus be formed to includes one or more outcoupling surfaces 108*a* tilted, with selected tilt angle, away from a plane or axis generally being codirectional with the substrate film at least in the immediate vicinity of the outcoupling surface 108*a*.

The outcoupling surface 108*a* may comprise a surface topography that is not a flat surface such as that shown in FIGS. 1A and 1B. A portion of the outcoupling surface 108*a* may be shaped to comprise a tilted surface. In further embodiments, the outcoupling surface 108*a* may comprise any other shape, configured, however, to reflect and redirect incident light to a selected direction. The light may be reflected and redirected at least to the selected direction, while yet naturally at least a portion of the incident light may additionally be reflected and redirected to one or more further directions.

The light originally emitted by the light source 104 and propagated within the optically transmissive layer 108 is thus to be reflected by the surface 108*a*. The outcoupling surface 108*a* may therefore be configured in the optically transmissive layer 108, where the layer 108 defines the outcoupling surface 108*a*, as being shaped into the layer, to reflect and steer light emitted by the light source 104 and incident on the outcoupling surface 108*a* to propagate towards at least the selected direction. At least some of the light may be reflected towards an outcoupling area 122 (as the selected direction), which may define an area of the structure 100 at least through which at least a portion of the light emitted by the at least one light source 104 shall be outcoupled from the structure 100 and to the environment of the structure 100, e.g. for perception by an external viewer 113 such as user of the structure 100 or device with which the structure 100 may be associated.

Figure 1:
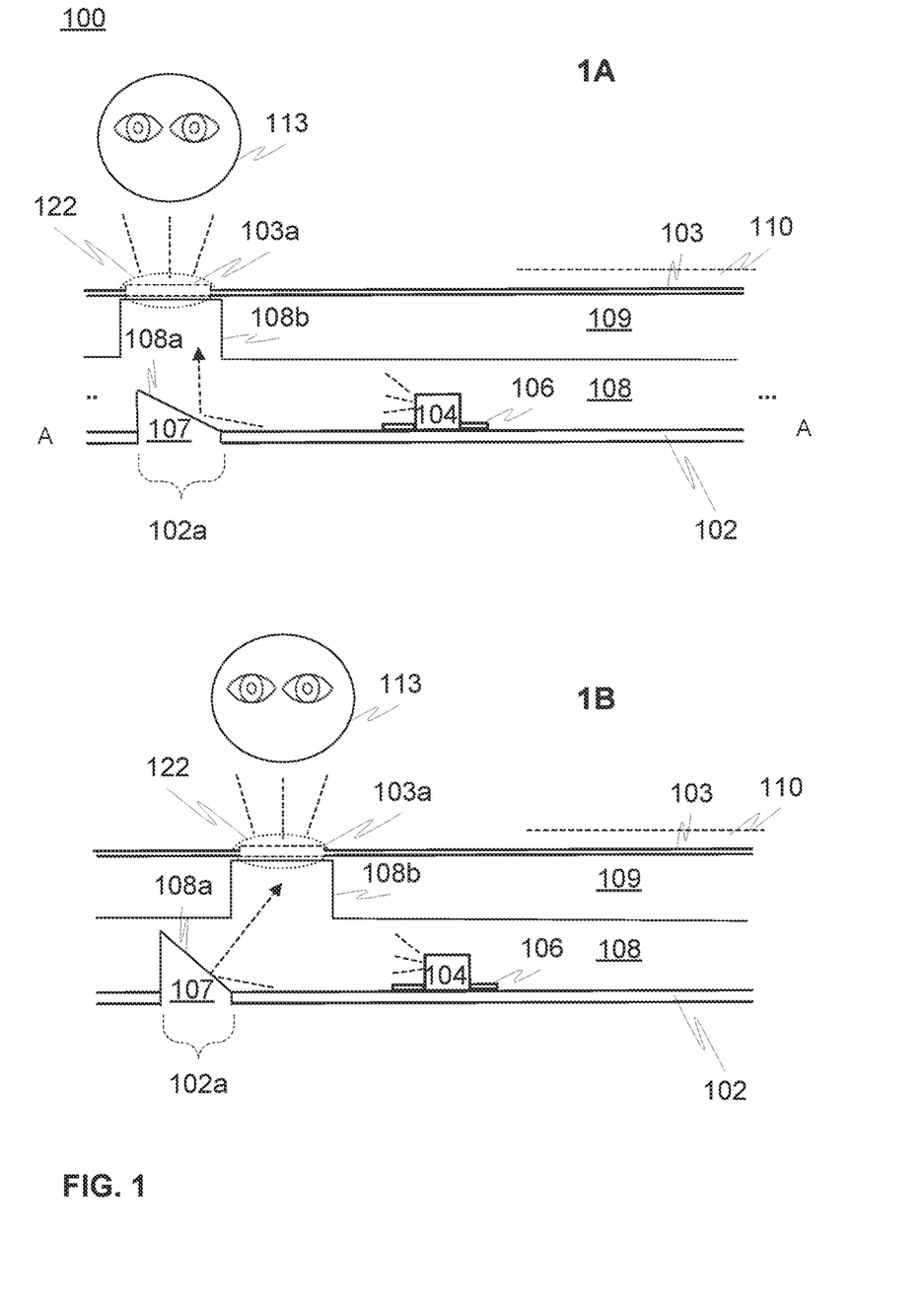
FIG. 1 illustrates at 1A and 1B various features and aspects of the present invention via embodiments of a multilayer structure in accordance therewith.

The light source 104 may be positioned as desired having regard to the respective outcoupling surface(s) 108*a*. The light source 104 may be located aside and farther away from the associated outcoupling surface(s) due to a variety of reasons, which may include hiding or masking the source 104 better from external perception or enhancing the uniformity of illumination (e.g., brightness and/or color(s)) provided to externals of the structure 100 through an outcoupling area 122 by letting the light emitted by the source 104 to propagate within the optically transmissive layer 108, for a longer distance and period in favour of improved mixing, for example. FIG. 1 shows only a single light source 104 for improved clarity, and in many embodiments one source 104 might be sufficient if not advantageous, but as being easily comprehended by a person skilled in art, there are countless embodiments e.g., in the field of large area illumination that might benefit from including several light sources 104 and utilizing shared or separate outcoupling surfaces 108*a* in the structure, either having at least partially joined or separate outcoupling area(s) 122 associated with them, affecting the positioning and orientation of the light sources 104.

The reflectance of outcoupling surface 108*a* is preferably at least locally about 75%, more preferably at least about 90%, and most preferably at least about 95% at selected, optionally essentially all visible, wavelengths of light such at least part of the wavelengths emitted by the source(s) 104. The reflectance is preferably such that the achieved reflection is by TIR (total internal reflection).

FIGS. 1A and 1B show the hole 102*a* as a through hole where a portion of the substrate film 102 is removed. However, in some embodiments the hole 102*a* may be provided e.g. as an incision-type hole or cut into the substrate film 102. In such a case, the outcoupling surface 108*a* may at least partially be formed by the surface of the substrate film 102.

The structure may comprise, in connection with the one or more holes 102*a*, a greater cavity 107 limited by at least the outcoupling surface 108*a* of the optically transmissive layer 108 and/or side walls of the substrate film 102 defining the hole. The cavity 107 may be filled with fluid such as air or other gaseous substance, or with preferably molded material. The fluid or other material filling the greater cavity 107 should preferably comprise a refractive index that is smaller than a refractive index of the material of the optically transmissive layer 108.

The optically transmissive layer 108 may further comprise at least one recess or protrusion 108b. The protrusion may be at least cross-sectionally rectangular or angled. The recess or protrusion 108b may be provided substantially upon at least one of the one or more holes 102a extending away from the substrate film 102 and/or in the optical path of light incident and reflected from the outcoupling surface 108a. FIG. 1A shows a protrusion 108b that is provided substantially upon a hole 102a and associated outcoupling surface 108a. FIG. 1B shows a protrusion being provided in the optical path of light reflected from the outcoupling surface 108a. A recess or protrusion 108b may be provided essentially beneath an outcoupling area 122 in a thickness direction of the structure.

Item 106 refers to a circuit design in the form of electrical, optionally additively produced such as screen printed or otherwise printed, conductors such as traces and/or contact pads, which may optionally further act as thermal conductors. The conductors may be used for power and data transfer purposes, for example, between the elements of the structure 100 and/or with external elements. The circuit design 106 may provide control signal and power to the light source 104 from a controller and power circuit(s), respectively, among other uses. The circuit design 106 may connect to an external device via e.g., wiring- or connector-containing exterior surface or edge of the structure 100. Additionally or alternatively, wireless connectivity may be applied based on e.g., electromagnetic or particularly, inductive coupling among other options.

A multilayer structure 100 may comprise any number of further functional elements (not depicted in FIG. 1A or 1B). The further functional elements may comprise for example one or more of a data processing element, SIP (system-in-a-package), photovoltaic cell, energy reservoir, capacitor, supercapacitor, memory element, sensor, electrode, connector (116) such as an electrical connector, capacitive sensor or sensing element, force sensor or sensing element, pressure sensor or sensing element, light sensor or sensing element, strain gauge, heating or de-icing element, and/or a camera.

The structure 100 may further comprise at least one optically masking and preferably essentially opaque, or an optically transmissive, optionally still translucent, constituent layer 109. The constituent layer 109 may comprise polymethyl methacrylate or other material preferably having a lower melt temperature than the optically transmissive layer 108. The constituent layer 109 may be provided, preferably molded, upon the optically transmissive layer 108. A constituent layer 109 may alternatively be otherwise produced, such as prepreared and thereafter placed upon the optically transmissive layer 108.

A recess or protrusion 108b may in some embodiments where a constituent layer 109 is provided, be configured to extend away from the substrate film 102 such that the reflected light may traverse in the selected direction through the transmissive layer 108 and to the outcoupling area 122 essentially such that the light reflected and directed into the selected direction may reach an outcoupling area 122 essentially without traveling through the constituent layer 109. When a constituent layer 109 is essentially opaque, light from the at least one light source 104 may in some embodiments thus only essentially exit the multilayer structure via the one or more outcoupling areas 112.

The multilayer structure 100 may additionally comprise at least one further film 103 on a side of the optically transmissive layer 108 opposite to the side facing the substrate film 102. The further film 103 may face the use environment and potential user 113 of the structure 100. The further film 103 may optionally comprise a plurality of at least partially physically separate portions with holes in between.

The further film 103 may comprise optical masking capacity providing translucent or opaque surface or volume, such as a dyed or pigmented surface or volume.

The further film 103 may further comprise one or more light processing features 103a, which may be scattering features such as a translucent print or a surface relief structure. The light processing features 103a may be provided at the location of the outcoupling area 112.

The structure 100 may yet further comprise a preferably molded shell layer 110 on the further film 103. The shell layer 110 may be at least partially optically clear, opaque or translucent, further optionally painted.

Figure 2:
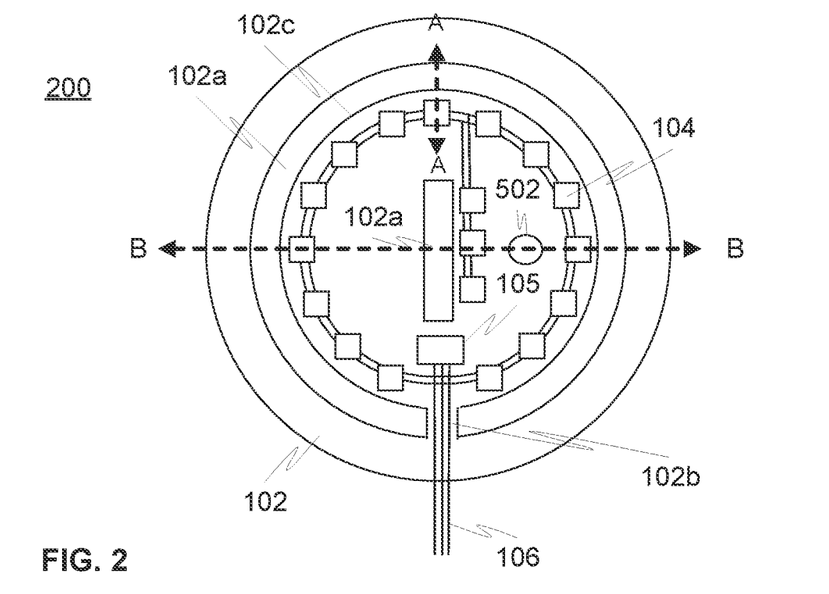
FIG. 2 shows a top view of the multilayer structure of FIG. 1A.

FIG. 2 illustrates a top or planar view of at least a portion of a multilayer structure 100, such as the structure of FIG. 1A. The section A-A illustrates a portion of the structure 100 of which FIG. 1A illustrates a cross-sectional view. FIG. 2 exhibits especially the substrate film 102 and associated features along with electronic features provided thereon, with a plurality of light sources 104 and a further functional element 105.

FIG. 2 shows one embodiment of a multilayer structure 200 with a substrate film 102, wherein an elongated bridge portion 102b is provided to host at least a portion of the circuit design 106 to provide an electrical connection to the light sources 104 and optionally further functional element(s) 105 provided on the substrate film 102. The electrical connection may be provided from an external device or a further layer of the multilayer structure 100.

In the embodiment of FIG. 2, holes 102a are provided in the substrate film 102 so that the substrate film 102 comprises an island portion 102c, shown here as an essentially central portion, which is at least partially separated from other portions of the substrate film 102, while remaining connected to the remaining portions of the substrate film 102 by the bridge portion 102b. FIG. 2 shows one example of holes 102a, bridge portion 102b, and island portion 102c, while naturally other possible shapes and numbers of hole 102a, bridge portion 102b, and island portion 102c are also possible. The elongated bridge portion 102b may provide an electrical connection to one or more light sources 104 and optionally further functional elements 105 while at least one island portion 102c is otherwise essentially isolated from the rest of the substrate film 102. A selected visual form regarding light being outcoupled from the structure may then be exhibited by the structure through the shape of the hole(s), while still providing functionality to the electronics.

The substrate film 102 of FIG. 2 additionally comprises an injection hole 502. The injection hole 503 extends through the substrate film 102 (and preferably also the optically transmissive layer 108, which is not shown in FIG. 2). The injection hole may be used in an injection molding process for injection molding of at least a constituent layer 109. Optionally an optically transmissive layer 108 may be injection molded through an injection hole 502 of the substrate film 102. At least part of an optically transmissive layer 108 may additionally or alternatively be injection molded through at least one of the holes 102a.

Figure 3:
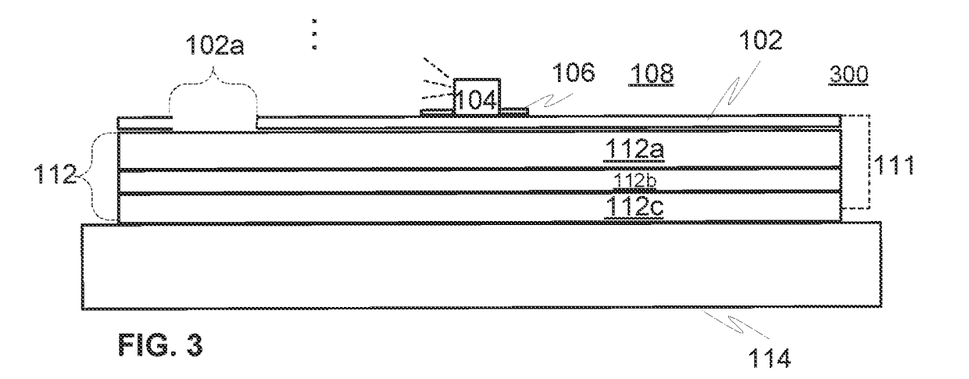
FIG. 3 illustrates one further example of a multilayer structure, exhibiting features that may be comprised beneath the substrate film of a structure according to an embodiment of the invention, such as the multilayer structure of any of FIG. 1,2, 5, or 6.

FIGS. 3 (at 300) and 4 (at 400) show portions of a multilayer structure 300, 400 exhibiting features that may be comprised beneath the substrate film 102 of a structure according to an embodiment of the invention. The structures 300, 400 of FIGS. 3 and 4 may comprise any features as described elsewhere herein regarding the substrate 102 and any of its features (holes 102a, bridge 102b, and island portion 102c), the light sources 104, circuit design 106, optically transmissive layer 108, and constituent layer 109, for instance.

FIG. 3 illustrates a secondary layer structure 112 provided on a second side of the substrate film 102, i.e. a side opposite to the side facing the optically transmissive layer 108. The secondary layer structure 112 may comprise at least a conductive shielding layer 112b, which may be separated from the substrate film 102 by an intermediate layer 112a. As a third layer beneath the substrate film 102, the secondary layer structure 112 may comprise at least one additional layer 112c facing the second side of the conductive shielding layer 112b.

The conductive shielding layer 112b may comprise or consist of conductive ink such as silver ink copper film or other conductive material film. The at least one intermediate layer 112a may be an adhesive layer, such as an adhesive tape layer. The at least one additional layer 112c may also be an adhesive layer, such as an adhesive tape layer. The secondary layer structure 112 may be provided as integrated multi-layer adhesive tape.

The shielding layer 112b may be electrically connected 111 to the circuit design 106 on the first substrate film 102. At least one electrically conductive via may be provided through the substrate film 102 for this purpose, or it may be carried out by an at least partially externally configured wiring portion.

The embodiment of FIG. 3 may be advantageous when the multilayer structure comprises, on the first side of the substrate film 102, at least one capacitive element such as capacitive sensor or sensing element as a further functional element 105. The structure 300 may be configured to face and contact an external host surface 114 via the secondary layer structure 112. The host surface 114 may be an electrically conductive surface, such as metal sheet. Especially if the host surface 114 is electrically conductive and potentially not grounded and in an unknown potential, the performance of capacitive sensing elements in the structure may be reduced. The conductive shielding layer 112b can be used to shield the functionality of the capacitive sensing elements from unwanted effects. Dual function adhesive tape may regularly be used to attach the structure to a host surface, whereby in this embodiment, the integrated multilayer adhesive tape 112 may be provided as comprising the conductive shielding layer 112b to enhance the functionality of capacitive sensing elements. If a conductive shielding layer 112b directly contacts the substrate film 102 and only one layer of additional material is provided as an adhesive tape layer as an additional layer 112c, there is only the substrate film 102 thickness between the capacitive sensing element(s) and conductive shielding layer 112b. In advantageous embodiments of the invention, however, the provided secondary layer structure 112 may increase the distance between the capacitive sensing element(s) and conductive shielding layer 112b. This may increase capacitive sensor performance and reading distance.

Figure 4:
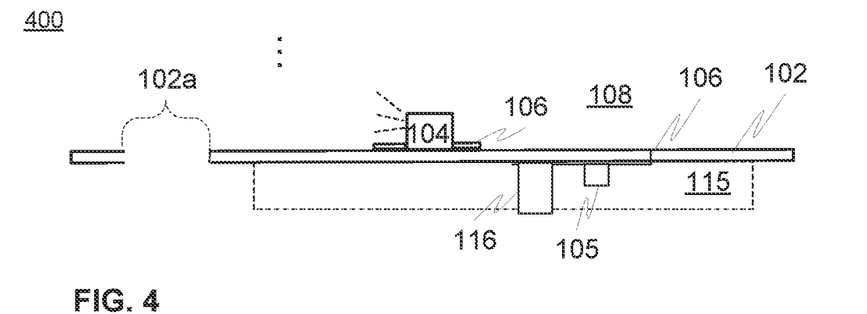
FIG. 4 shows an example of a multilayer structure, exhibiting features that may be comprised beneath the substrate film of a structure according to an embodiment of the invention, such as the multilayer structure of any of FIG. 1,2, 5, or 6.

FIG. 4 shows a multilayer structure 400 comprising further functional elements 105, 116 on the second side of the substrate film 102. The structure 400 may then comprise a molded layer 115 on the second side of the substrate film 102, at least partially embedding the further functional elements 105, 116. At least a part of the circuit design 106 may extend, e.g. by electrically conductive via, to the second side of the substrate film 102 and electrically connect with the further functional elements 105, 116 thereon. In particular, at least one of the further functional elements may comprise at least one connector 116 for connecting to an external entity.

Figure 5:
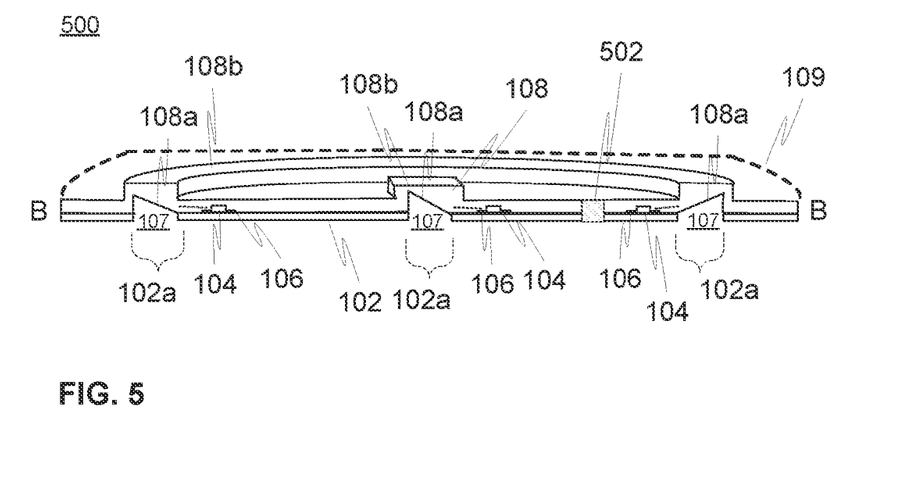
FIG. 5 shows an example of a multilayer structure.

FIG. 5 illustrates a cross-sectional view of a multilayer structure 500. This view may be a cross-sectional view relating to section B-B of FIG. 2 but exhibiting also the optically transmissive layer 108 and a constituent layer 109. FIG. 5 shows outcoupling surfaces 108a and associated greater cavities 107. It may be noted that the outermost outcoupling surfaces 108a and greater cavities 107 on the left- and right-hand sides of FIG. 5 are part of the same structure, i.e. are associated with the same hole 102a. The different outcoupling surfaces 108a (and greater cavities 107) of FIG. 5 are similar but of course they may however vary, also at different locations with respect to the same hole 102a.

Protrusions 108b are provided in the optically transmissive layer 108 in connection with the outcoupling surfaces 108a. Light sources 104 are being shown as directing light towards an outcoupling surface 108a. One light source 104 may be configured to direct light to one or more outcoupling surfaces 108a. Light from one light source 104 may be configured to be redirected e.g. to a plurality of outcoupling areas 122.

A constituent layer 109 is depicted as being provided on the optically transmissive layer 108. The constituent layer 109 may be provided as is shown in connection with FIGS. 1A and 1B, wherein there is essentially no constituent layer 109 provided at the location of the outcoupling area(s) 122.

FIG. 5 illustrates an injection 502 extending through both the substrate film 102 and the optically transmissive layer 108. The injection hole 502 may be essentially concentric regarding the holes provided in the substrate film 102 and in the optically transmissive layer 108. In a produced multilayer structure, the injection hole 502 may be filled (at least partially) with material of the constituent layer 109.

Figure 6:
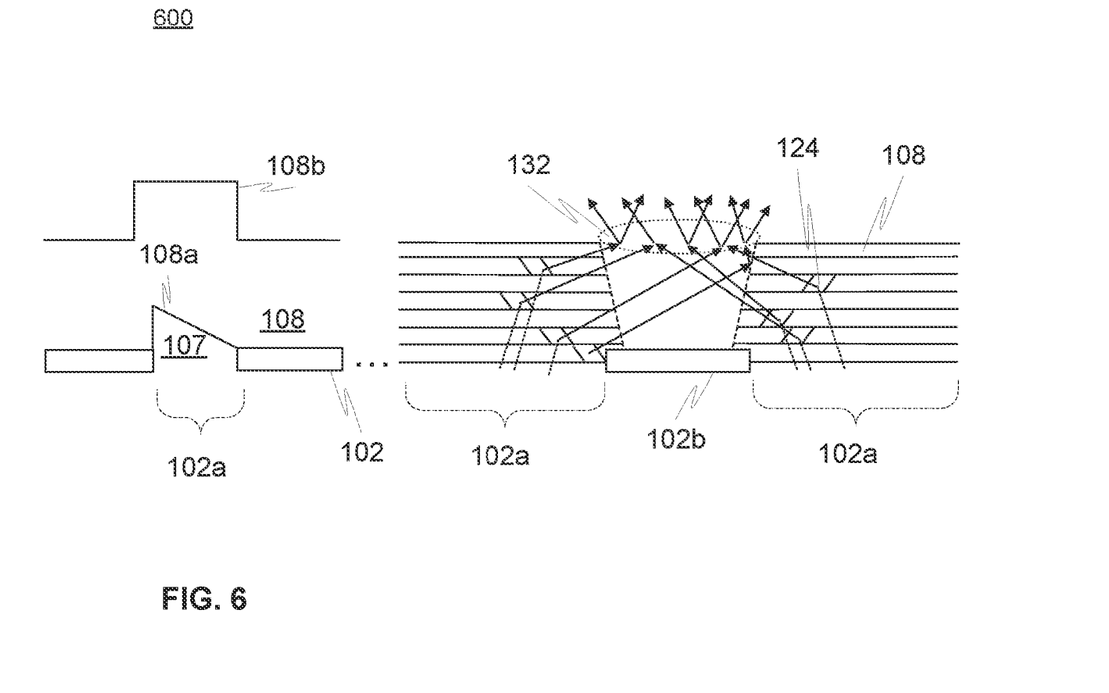
FIG. 6 illustrates a portion of a multilayer structure.

FIG. 6 shows a cross-sectional view of a portion of a multilayer structure 600. Here, the substrate film 102 is provided with a bridge portion 102b. The structure 600 may comprise at least one light directing or scattering feature 124. The at least one light directing or scattering feature 124 may be provided in or on the substrate film 102 and/or in the optically transmissive layer 108. The light directing or scattering features 124 may be configured to direct or spread incident light upon the bridge portion 102b of the substrate film 102, or at least such that regarding a bridge outcoupling area 132, light emitted by one or more light sources 104 may be directed towards the bridge outcoupling area 132. The at least one light directing or scattering feature may comprise printed diffusive ink, diffusive surface relief pattern, and/or diffusive particles. The directing of light may thus be compensated for at the bridge portion 102b, such that the light is directed towards at least one bridge outcoupling area 132 even at the bridge portion 102b of the substrate film 102, where the bridge portion 102b is not associated with an outcoupling surface 108a. FIG. 6 shows further features comprised elsewhere in the structure 600, such as holes 102a of the substrate film 102, outcoupling surface 108a, and protrusion 108b. Light sources 104 and circuit design 106 are not depicted, while the structure 600 will naturally comprise such features as well, along with possible further optional features.

Figure 7:
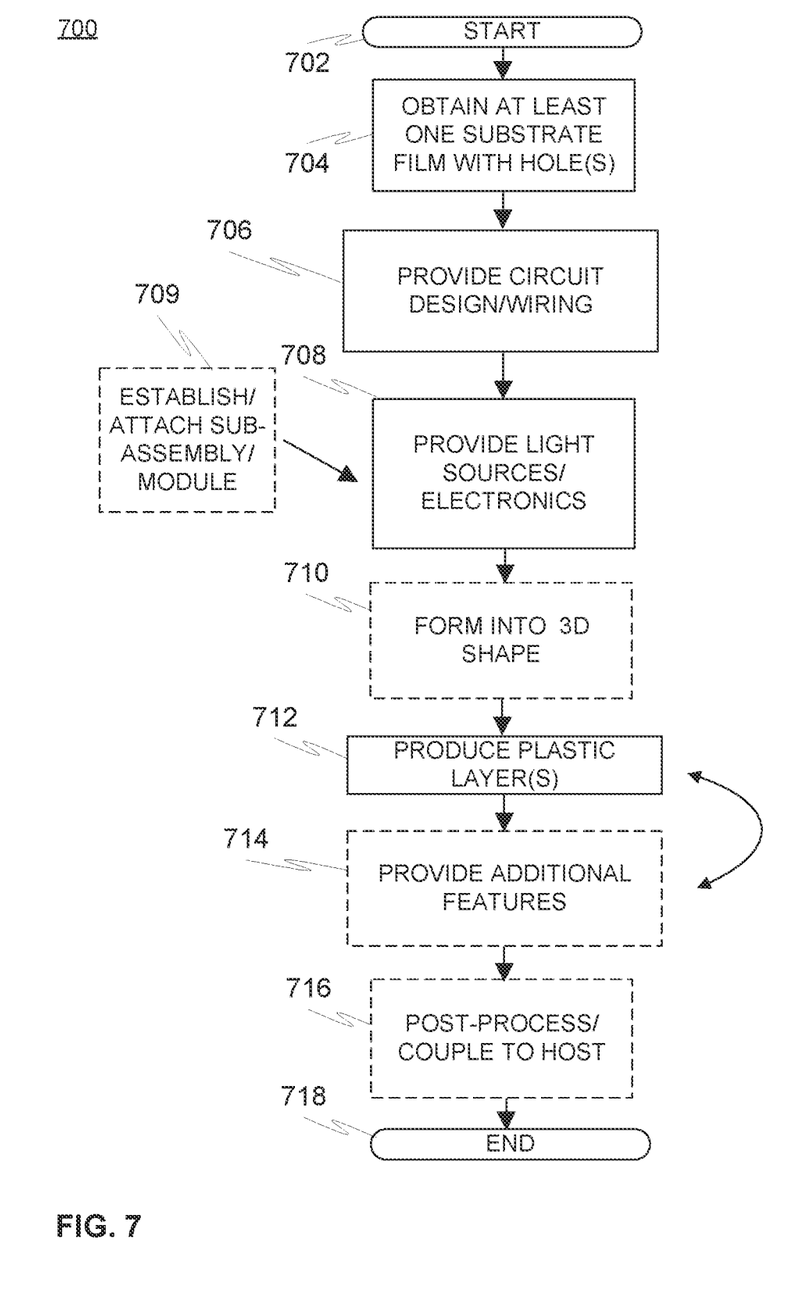
FIG. 7 is a flow diagram of an embodiment of a method in accordance with the present invention.

FIG. 7 shows, at 700, a flow diagram of an embodiment of a method for manufacturing an integrated optically functional multilayer structure in accordance with the present invention. As applicable manufacturing processes and related characteristics regarding possible constituent elements and materials of various embodiments of the structure have already been discussed also hereinbefore, these discussions are not unnecessarily repeated here in favour of clarity of the overall, already lengthy method description. However, a person skilled in the art will appreciate the fact that they can revert to the previous paragraphs for finding valuable details also with respect to applicable manufacturing methods and considerations, while in terms of structural or functional details potentially included in the multilayer structure, the same applies also in reverse direction.

At the beginning of the method for manufacturing the multilayer structure, a start-up phase 702 may be executed. During the start-up, the necessary preparatory tasks such as material, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding, IMD (in-mold decoration), lamination, bonding, (thermo)forming, electronics assembly, cutting, drilling, perforation, printing and/or measurement such as desired optical measurements—providing equipment, among others, may be thus ramped up to operational status at this stage.

The start-up phase 702 may in some cases comprise design, selection, or otherwise provision of a mold tool with selected characteristics, such as shape, for inserting into one or more holes of the substrate film for establishing a selected outcoupling surface. The shape of the mold tool may then determine the shape of an associated greater cavity.

At 702, at least one, preferably flexible, substrate film of plastics or other material for accommodating e.g., light source(s) and potentially other electronics is obtained. The substrate film may initially be substantially planar or e.g., curved. The substrate film may at least dominantly be of electrically substantially insulating material(s). A ready-made element, e.g., a roll or sheet of plastic film, may be acquired for use as the substrate material. In some embodiments the substrate film itself may be first produced in-house by molding using a mold or molding device or other methods from selected starting material(s). Optionally, the substrate film may be processed further at this stage. At 702, the method may comprise obtaining a substrate film with at least one hole or the method may comprise at this stage also creating of one or more holes in the substrate film. The one or more holes, essentially through-holes or at least incisions, may determine a desired pattern or area for outcoupling light from the internals of the structure to an environment of the structure.

At 706, a number of electrically and optionally thermally conductive elements defining e.g., various conductor lines (traces), sensing elements such as electrodes, and/or contact areas such as pads to construct a circuit design are provided on the substrate film, preferably by one or more additive techniques of e.g., printed electronics technology or 3D printing. Accordingly, the circuit design may comprise several circuits or circuit sub-designs on different layers of the overall construction, optionally being connected via conductive wiring e.g., through intermediate layer(s) or via the edge of the structure. For example, screen, inkjet, flexographic, gravure or offset lithographic printing may be applied by a suitable printing device or devices for producing at least portion of the circuit design. In some cases, also subtractive or semi-additive processes may be utilized. Further actions cultivating the substrate film(s) involving e.g., printing or generally provision of graphics, visual indicators, optical elements such as masks or outcoupling elements, holes/fills, etc. thereon or thereat may take place here if not already executed e.g., at 1004.

In various embodiments the electrically and optionally thermally conductive elements (traces, pads, connection elements, electrodes, etc.) may include at least one material selected from the group consisting of: conductive ink, conductive nanoparticle ink, copper, steel, iron, tin, aluminium, silver, gold, platinum, conductive adhesive, carbon fibre, graphene, alloy, silver alloy, zinc, brass, titanium, solder, and any component thereof. The used conductive materials may be optically opaque, translucent and/or transparent at desired wavelengths, such as at least portion of visible light, so as to mask or let the radiation such as visible light to be reflected therefrom, absorbed therein or get through, for instance. As practical examples of feasible conductive material, e.g. Dupont™ ME602 or ME603 conductive ink may be utilized.

At 708, at least one or more light sources (e.g. LEDs) are provided on the substrate film, along with possible further circuitry such as one or more typically ready-made components including electronic components such as various SMDs, which are attached to the contact areas on the film(s) e.g. by solder and/or adhesives. For example, e.g., different elements of control and/or driving electronics, communication, sensing, connecting (e.g. connectors), hosting (circuit board(s), carrier(s), etc.) and/or power provision (e.g. battery) element may also be provided, depending on the embodiment.

A suitable pick-and-place or other mounting device may be utilized for the purpose, for instance. Alternatively, or additionally, printed electronics technology may be applied to actually manufacture at least part of the components, such as OLEDs (organic LED), directly onto the film(s) in situ. Accordingly, the execution of items 706, 708 to provide the multilayer structure with desired circuitry may temporally overlap as being understood by a skilled person. Yet, the components prepared or installed herein may also include various optical elements such as lenses, reflectors, diffusers, masks, filters, etc.

Non-conductive and/or conductive adhesive may be utilized for securing the components. In some embodiments, mechanical securing is implemented or at least enhanced by non-conductive adhesive material whereas solder or other electrically highly conductive (but to lesser extent, adhesive type of) material is used for electrical connection.

Selected elements may be subjected to further processing such as encapsulation.

Item 709 specifically refers to preparation and attachment of one or more, at least partially pre-prepared, modules, such as 'sub-assemblies', which may incorporate an initially separate, secondary substrate such as a circuit board provided with a local circuit design and electronics such as a number of light source(s), IC(s) and/or various other elements or components, such as optical or structural ones (e.g. wall structure, diffuser, lens, carrier elements, etc.).

At least part of the electronics and/or other elements of the final multilayer structure may be thus conveniently provided to the substrate film(s) via fully or partially pre-manufactured module(s) or sub-assembly/assemblies. Optionally, a concerned module or sub-assembly may be at least partially overmolded or generally covered by protective material such as plastic layer prior to attachment to the main substrate.

For example, adhesive, pressure and/or heat may be used for mechanical bonding of the module or sub-assembly with the primary (host) substrate. Solder, wiring, and conductive ink are examples of applicable options for providing the electrical and/or thermal connections between the elements of the module or sub-assembly and with the remaining electrical and/or thermal elements on the main substrate.

Items 706 and 708 may comprise provision of the circuit design or associated wiring and provision of at least one light source and potential further functional elements on at least the first side of the substrate film and optionally also the second side of the substrate film.

In some embodiments, the substrate film optionally already containing electronics such as at least part of the circuit design and/or the light source or other circuitry, may be optionally formed 710 into 3D shape using thermoforming or cold forming, for instance, to exhibit a desired shape such as at least locally a three-dimensional (essentially non-planar) shape. Applicable former device such as a thermoformer may be utilized for the purpose. Additionally or alternatively, at least some forming could take place after molding in case the already-established multilayer stack is designed to survive such processing.

At 712, an optically transmissive, preferably plastic, layer is produced at least upon the first side of the substrate film and the light source(s) thereon, the optically transmissive layer at least partially covering the light source(s).

Preferably the optically transmissive layer or in some embodiments, multiple layers provided, preferably comprising plastic or thermoplastic or in some embodiments optionally thermoset layer(s), are manufactured through molding such as injection molding, upon the substrate. Other possible molding methods may include e.g. injection molding, high pressure molding, low pressure molding, silicone molding, or epoxy molding. Desired portions may be left clear or cleared afterwards with mechanical or chemical processing, considering e.g., a cover portion of lighting module or other module intended to host replaceable or generally accessible (e.g., inspectable or reprogrammable) components. Such module may then also include a (re)movable cover part for providing access to the internals thereof.

The molded material(s) may be provided using several molding steps or shots, or via a single step, wherein the molded material may even optionally flow through a substrate film from one side thereof to the opposing side via a hole prepared therein or by penetrating through the substrate material itself (e.g. through a thinned/thinner portion), for example. The molding material(s) may be, and in many embodiments preferably are, at least dominantly electrically insulating. Adhesion promotion material may be utilized on the films neighbouring the molded plastics.

Yet, item 712 includes directing of a mold tool through the substrate film from an opposite second side to the first side of the substrate film via the one or more holes in the substrate film. Material subsequently flowing around the mold tool on the first side of the substrate film during molding thus establishes and defines the optically transmissive layer to comprise a light outcoupling surface. The light outcoupling surface may then be preferably at least partially tilted away from a surface plane or direction defined by adjacent areas of the substrate film. The formed light outcoupling surface then abuts a cavity established on the first side of the substrate film from the space occupied by the mold tool during molding.

The producing 712 of plastic layer(s) may also comprise producing the optically transmissive layer as comprising one or more recesses or protrusions extending away from the substrate film as described earlier herein.

At 712, one or more further molded layers may also be established, such as a molded layer on the second side of the substrate film.

The method may comprise producing, at 712 and preferably through molding such as injection molding, an optically masking and preferably essentially opaque, or an optically transmissive, optionally still translucent, constituent layer. The constituent layer may be produced prior to or subsequent to molding an optically transmissive layer.

In some embodiments, an optically transmissive layer is molded before a constituent layer, and the method further comprises providing an injection hole to extend through both substrate film and optically transmissive layer, the method further comprising injection molding the material of the constituent layer through the injection hole.

At 714, additional features may be provided. Such additional features may comprise e.g. provision one of more further films and possible molding of shell layer thereon. Provision of additional features may further comprise provision of e.g. multi-layer adhesive tape comprising a conductive shielding layer between layers of adhesive tape. In some embodiments of a method, at least a surface portion of the optically transmissive layer and/or an additional layer or a film thereon may be colored by optionally opaque paint or dye to provide an optical mask.

Regarding the resulting overall thickness of the obtained stacked multilayer structure, the thickness depends e.g., on the used materials and related minimum material thicknesses providing the necessary strength in view of the manufacturing and subsequent use. These aspects are to be considered on case-by-case basis. For example, the overall thickness of the structure could be in the order of magnitude of about some millimeters as discussed herein elsewhere, but considerably thicker or thinner embodiments are also feasible.

Item 716 refers to a number of potential additional tasks such as post-processing and installation tasks. Further layers, single-layer or multilayer films, or generally additional features, may be added into the multilayer structure by molding, printing, lamination e.g., by heat, adhesive, or pressure, or suitable coating (e.g. deposition) procedure, not forgetting other possible positioning or fixing techniques and subtractive technologies such as lasering. The layers may be of protective, indicative and/or aesthetic value (graphics, colors, figures, text, numeric data, etc.) and contain e.g., textile, leather or rubber materials instead of or in addition to plastics.

Additional elements such as electronics, modules, module internals or parts, and/or optics may be installed and fixed e.g., at the outer surface(s) of the existing structure, such as the exterior surface of an included film or a molded layer depending on the embodiment. For example, optical features such as a lens structure or a diffuser could be constructed or finalized here by processing the thermoplastic layer or any further layer or element thereon by adding material thereon or removing material therefrom (lasering is one option).

At 718, method execution is ended.

The scope of the present invention is determined by the attached claims together with the equivalents thereof. A person skilled in the art will appreciate the fact that the dis-closed embodiments were constructed for illustrative purposes only, and other arrangements applying many of the above principles could be readily prepared to best suit each potential use scenario.

The invention claimed is:

1. An integrated optically functional multilayer structure, comprising:

a flexible, substrate film arranged with a circuit design comprising at least a number of electrical conductors on a first side of the substrate film;

at least one light source provided upon the first side of the substrate film and connected to the circuit design, said at least one light source being configured to internally illuminate at least a portion of the structure for external perception; and an optically transmissive layer produced upon the first side of the substrate film and the at least one light source, said optically transmissive layer at least partially covering the substrate film and embedding the at least one light source;

wherein the substrate film defines one or more holes therethrough and upon one or more of them the optically transmissive layer defines an outcoupling surface, configured to redirect and reflect, incident light emitted by one or more light sources of the at least one light source, and wherein the substrate film comprises at least one elongated bridge portion hosting a part of the circuit design providing electrical connection to the at least one light source and wherein the substrate film further comprises an island portion, at least partially separated from other portion of the substrate film by one or more of said one or more holes while remaining connected thereto by the at least one bridge portion.

2. The structure of claim 1 comprising, in connection with said one or more holes, a greater cavity limited by at least the outcoupling surface of the optically transmissive layer and/or side walls of the substrate film defining the hole.

3. The structure of claim 1 wherein the outcoupling surface defines or comprises one or more light processing or redirecting features.

4. The structure of claim 1, comprising at least one light directing or scattering feature, configured to direct or spread incident light upon the bridge portion of the substrate film.

5. The structure of claim 1, wherein the optically transmissive layer defines a recess or protrusion, substantially upon at least one of the one or more holes extending away from the substrate film and/or in an optical path of light incident and reflected from the outcoupling surface.

6. An integrated optically functional multilayer structure, comprising:

a flexible, substrate film arranged with a circuit design comprising at least a number of electrical conductors on a first side of the substrate film;

at least one light source provided upon the first side of the substrate film and connected to the circuit design, said at least one light source being configured to internally illuminate at least a portion of the structure for external perception; and an optically transmissive layer produced upon the first side of the substrate film and the at least one light source, said optically transmissive layer at least partially covering the substrate film and embedding the at least one light source;

an optically masking or an optically transmissive, constituent layer, wherein the substrate film defines one or more holes therethrough and upon one or more of them the optically transmissive layer defines an outcoupling surface, configured to redirect and reflect, incident light emitted by one or more light sources of the at least one light source, and wherein the substrate film and the optically transmissive layer define an injection hole extending through both and being filled with material of the constituent layer provided through the injection hole.

7. The structure of claim 6, comprising a further film on a side of the optically transmissive layer opposite to the side facing the substrate film.

8. The structure of claim 7, wherein the further film comprises optical masking capacity—providing translucent or opaque surface or volume.

9. An integrated optically functional multilayer structure, comprising:

a flexible, substrate film arranged with a circuit design comprising at least a number of electrical conductors on a first side of the substrate film;

at least one light source provided upon the first side of the substrate film and connected to the circuit design, said at least one light source being configured to internally illuminate at least a portion of the structure for external perception;

an optically transmissive layer produced upon the first side of the substrate film and the at least one light source, said optically transmissive layer at least partially covering the substrate film and embedding the at least one light source; and a molded layer on a second side of the substrate film, at least partially embedding one or more of the at least one functional element, wherein the substrate film defines one or more holes therethrough and upon one or more of them the optically transmissive layer defines an outcoupling surface, configured to redirect and reflect, incident light emitted by one or more light sources of the at least one light source, and wherein the substrate film comprises, on the first side and/or opposite second side thereof, at least one functional element selected from the group consisting of: data processing element, SIP (system-in-a-package), photovoltaic cell, energy reservoir, capacitor, supercapacitor, memory element, sensor, electrode, connector including an electrical connector, capacitive sensor or sensing element, force sensor or sensing element, pressure sensor or sensing element, light sensor or sensing element, strain gauge, heating or de-icing element, and a camera.

10. An integrated optically functional multilayer structure, comprising:

a flexible, substrate film arranged with a circuit design comprising at least a number of electrical conductors on a first side of the substrate film;

at least one light source provided upon the first side of the substrate film and connected to the circuit design, said at least one light source being configured to internally illuminate at least a portion of the structure for external perception; and an optically transmissive layer produced upon the first side of the substrate film and the at least one light source, said optically transmissive layer at least partially covering the substrate film and embedding the at least one light source;

wherein the substrate film defines one or more holes therethrough and upon one or more of them the optically transmissive layer defines an outcoupling surface, configured to redirect and reflect, incident light emitted by one or more light sources of the at least one light source, wherein the substrate film comprises, on the first side and/or opposite second side thereof, at least one functional element selected from the group consisting of:

data processing element, SIP (system-in-a-package), photovoltaic cell, energy reservoir, capacitor, supercapacitor, memory element, sensor, electrode, connector including an electrical connector, capacitive sensor or sensing element, force sensor or sensing element, pressure sensor or sensing element, light sensor or sensing element, strain gauge, heating or de-icing element, and a camera, and wherein part of the circuit design extends to the second side of the substrate film and electrically connects with the at least one functional element thereon.

11. An integrated optically functional multilayer structure, comprising:

a flexible, substrate film arranged with a circuit design comprising at least a number of electrical conductors on a first side of the substrate film;

at least one light source provided upon the first side of the substrate film and connected to the circuit design, said at least one light source being configured to internally illuminate at least a portion of the structure for external perception;

an optically transmissive layer produced upon the first side of the substrate film and the at least one light source, said optically transmissive layer at least partially covering the substrate film and embedding the at least one light source; and an electrically conductive shielding layer, on a second, opposite, side of the substrate film, wherein the substrate film defines one or more holes therethrough and upon one or more of them the optically transmissive layer defines an outcoupling surface, configured to redirect and reflect, incident light emitted by one or more light sources of the at least one light source.

12. The structure of claim 11, further comprising at least one additional layer, positioned on a side of the shielding layer opposite to the side facing the substrate film.

13. The structure of claim 11, wherein the shielding layer is electrically connected to the circuit design on the first substrate film.

14. A method for manufacturing an integrated optically functional multilayer structure, comprising:

obtaining a flexible, substrate film containing one or more through-holes;

providing at least a first side of the substrate film with a circuit design comprising a number of electrical conductors;

arranging at least one light source upon the first side of the substrate film as connected to the circuit design; and producing, high pressure molding, low pressure molding, silicone molding or using one or more other manufacturing methods, an optically transmissive layer upon the first side of the substrate film and the at least one light source, said optically transmissive layer at least partially covering the substrate film and embedding the at least one light source, wherein a mold tool is partially directed through the substrate film from an opposite second side to the first side of the substrate film via said one or more through-holes so as to cause establishing, from material subsequently flowing around the mold tool on the first side of the substrate film and defining the optically transmissive layer, a light outcoupling surface, said light outcoupling surface abutting a cavity established on the first side of the substrate film from the space occupied by the mold tool during molding.

15. The method of claim 14, wherein obtaining the substrate film containing one or more through-holes comprises obtaining a substrate film and providing the substrate film with one or more through-holes.

16. The method of claim 14, wherein the one or more through-holes are provided in the substrate film to retain at least one elongated bridge portion of the substrate film, the method further comprising providing at least a part of the circuit design on the elongated bridge portion, thus providing electrical connection to the at least one light source.

17. The method of claim 16, comprising providing at least one light directing or scattering feature, configured to direct or spread incident light thereon upon the bridge portion of the substrate film.

18. The method of claim 14, wherein the provided mold tool is shaped to provide the transmissive layer with a greater cavity in connection with said one or more holes, said greater cavity being limited by at least the tilted outcoupling surface of the optically transmissive layer and/or side walls of the substrate film defining the hole.

19. The method of claim 14, wherein the optically transmissive layer is produced to define a recess or protrusion upon at least one of the one or more holes extending away from the substrate film.

20. The method of claim 14, the method further comprising producing, through molding an optically transmissive, constituent layer.

21. The method of claim 20, wherein the method comprises providing the substrate film and the optically transmissive layer to define an injection hole extending through both the substrate film and the optically transmissive layer and injection molding the material of the constituent layer through the injection hole.

22. The method of claim 14, the method comprising providing a further film on a side of the optically transmissive layer opposite to the side facing the substrate film.

23. The method of claim 14, the method comprising providing the substrate film, on the first side and/or opposite second side thereof, with at least one functional element selected from the group consisting of: data processing element, a SIP (system-in-a-package), photovoltaic cell, energy reservoir, capacitor, supercapacitor, memory element, sensor, electrode, connector.

24. The method of claim 14, comprising providing an electrically conductive shielding layer on a second, opposite, side of the substrate film.

25. The method of claim 24, further comprising providing at least one additional layer on a side of the conductive shielding layer opposite to the side facing the substrate film said shielding layer, intermediate layer, and at least one additional layer being integrated as a multi-layer adhesive element.

26. The method of claim 24, comprising providing an electrical connection between the shielding layer and the circuit design on the first substrate film through the substrate film or at least partially externally configured wiring portion.

27. The method of claim 24, wherein at least a surface portion of the optically transmissive layer and/or an additional layer or a film thereon is colored to provide an optical mask.

* * * * *